(12) United States Patent
Zocchi et al.

(10) Patent No.: US 8,594,277 B2
(45) Date of Patent: Nov. 26, 2013

(54) GRAZING INCIDENCE COLLECTOR OPTICAL SYSTEMS FOR EUV AND X-RAY APPLICATIONS

(75) Inventors: Fabio Zocchi, Samarate (IT); Pietro Binda, Bosisio Parini (IT); Enrico Benedetti, Montagna (IT)

(73) Assignee: Media Lario S.R.L., Bosisio Parini (LC) (IT)

( * ) Notice: Subject to any disclaimer, the term of this patent is extended or adjusted under 35 U.S.C. 154(b) by 76 days.

(21) Appl. No.: 12/735,525

(22) PCT Filed: Jan. 28, 2009

(86) PCT No.: PCT/EP2009/000538
§ 371 (c)(1),
(2), (4) Date: Jul. 23, 2010

(87) PCT Pub. No.: WO2009/095219
PCT Pub. Date: Aug. 6, 2009

(65) Prior Publication Data
US 2011/0043779 A1  Feb. 24, 2011

(30) Foreign Application Priority Data
Jan. 28, 2008  (EP) .................................... 08001535

(51) Int. Cl.
*G21K 1/06*  (2006.01)
(52) U.S. Cl.
USPC ........................................................ 378/84
(58) Field of Classification Search
USPC .................................................... 378/84, 85
See application file for complete search history.

(56) References Cited

U.S. PATENT DOCUMENTS

| | | |
|---|---|---|
| 2004/0108473 A1 | 6/2004 | Melnychuk et al. |
| 2004/0265712 A1 | 12/2004 | Lee |
| 2005/0016679 A1 | 1/2005 | Ruzic et al. |
| 2005/0155624 A1 | 7/2005 | Lee et al. |
| 2008/0013680 A1 | 1/2008 | Singer et al. |
| 2008/0018876 A1* | 1/2008 | Stuetzle et al. ................. 355/67 |

FOREIGN PATENT DOCUMENTS

| | | |
|---|---|---|
| EP | 1848004 | 10/2007 |
| WO | WO2007-003359 | 1/2007 |

OTHER PUBLICATIONS

Zocchi et al, "Design and optimization of collectors for extreme ultraviolet lithography," Proc. SPIE vo. 6151, Jan. 1, 2006.
Zocchi et al,, "Optical designs of grazing incidence collector extreme ultraviolet lithography," J. Micro/Nanolith., MEMS MOEMS vol. 6(4) 043002 (Oct.-Dec. 2007), XP055012855.

* cited by examiner

*Primary Examiner* — Courtney Thomas
(74) *Attorney, Agent, or Firm* — Opticus IP Law PLLC

(57) ABSTRACT

A collector optical system for EUV and X-ray applications is disclosed, wherein the system includes a plurality of mirrors arranged in a nested configuration that is symmetric about an optical axis. The mirrors have first and second reflective surfaces that provide successive grazing incidence reflections of radiation from a radiation source. The first and second reflective surfaces have a corrective shape that compensates for high spatial frequency variations in the far field intensity distribution of the radiation.

12 Claims, 5 Drawing Sheets

GRAZING INCIDENCE COLLECTOR OPTICAL SYSTEMS FOR EUV AND X-RAY APPLICATIONS

CLAIM OF PRIORITY

This application claims the benefit of priority under 35 U.S.C. §365 of International Patent Application Serial No. PCT/EP2009/000538, filed on Jan. 28, 2009, designating the United States of America, which in turn claims the benefit of priority under 35 U.S.C. §119 of European Patent Application Serial No. EP 08001535.7, filed on Jan. 28, 2008.

FIELD OF THE INVENTION

The present invention relates to reflective optical systems, and more particularly to improved collector optical systems for EUV and X-ray applications.

The invention has various applications in scenarios where EUV and X-ray radiation is used, but is particularly useful in lithography and imaging applications.

A simplified block diagram of an EUV lithography system is shown in FIG. 1 (PRIOR ART). The ultra-violet source 102 is normally an hot plasma the emission of which is collected by the collector 104 and delivered to an illuminator 106. The latter illuminates a mask or reticle 108 with the pattern to be transferred to the wafer 110. The image of the mask or reticle is projected onto the wafer 110 by the projection optics box 112. EUV lithography systems are disclosed, for example, in US2004/0265712A1, US2005/0016679A1 and US2005/0155624A1.

Presently, the most promising optical design for collectors 104 is based on nested Wolter I configuration, as illustrated in FIG. 2 (PRIOR ART). Each mirror 200 is a thin shell consisting of two sections (surfaces) 202, 204: the first one 202, closer to the source 102 is a hyperboloid whereas the second 204 is an ellipsoid, both with rotational symmetry, with a focus in common.

The light source 102 is placed in the focus of the hyperboloid different from the common focus. The light from the source 102 is collected by the hyperbolic section 202, reflected onto the elliptic section 204 and then concentrated to the focus of the ellipsoid, different from the common focus, and known as intermediate focus (IF) 206.

From an optical point of view, the performance of the collector 102 is mainly characterized by the collection efficiency and the far field intensity distribution. The collection efficiency is the ratio between the light intensity at intermediate focus 206 and the power emitted by the source 102 into half a sphere. The collection efficiency is related to the geometry of the collector 104, to the reflectivity of each mirror 200, to the spatial and angular distribution of the source 102, to the optical specifications of the illuminator. The far field intensity distribution is the 2D spatial distribution of the light intensity beyond the intermediate focus 206 at distances that depends on the illuminator design but that are normally of the same order of magnitude as the distance between the source 102 and intermediate focus 206.

The collector 104 is normally used in conjunction with a hot plasma source 102. Thus, the thermal load from UV radiation on the collector 104 is very high and a proper cooling system is required. The cooling system is positioned on the back surface of each mirror 200 in the shadow area that is present on the back side of both the elliptical section 204 and the hyperbolic section 202 (see FIG. 2 (PRIOR ART)).

The purpose of the collector 104 in EUV sources is to transfer the largest possible amount of in-band power emitted from the plasma to the next optical stage, the illuminator 106, of the lithographic tool 100 (see FIG. 1), the collector efficiency being as defined hereinabove. For a given maximum collection angle on the source side, the collector efficiency is mainly determined by collected angle and by the reflectivity of the coating on the optical surface of the mirrors.

A problem with known systems is how to significantly increase collector efficiency. The present invention seeks to address the aforementioned and other issues.

A. Far Field Improvement

A further problem with known systems is that the degree of uniformity of far field intensity distribution for the collector is lower than it might be, thereby effecting collector efficiency.

The uniformity of the far field intensity distribution has a direct impact on the illumination uniformity on the mask or reticle 108, thus affecting the quality of the lithographic process. Although the illuminator 106 is designed to partly compensate for the non-uniformity of the far field intensity distribution, there is a need for a design of the collector 104 that limits the non-uniformity of the far field intensity distribution. In particular, the high spatial frequency variation of the far field intensity distribution may be difficult to compensate.

The main source of the high spatial frequency variation of the far field intensity distribution is the shadowing due to the thickness of the mirrors 200. Such thickness is limited toward small values by mechanical and thermal considerations. Indeed, enough mechanical stiffness is required to the mirror 200 for manufacturing and integration purposes. In addition, the thermal conductance of the mirror 200 must be high enough to transfer the high thermal load produced by the hot plasma to the location of the cooling system.

In some cases, depending on the illuminator 106 and source specifications, the shadowing due to the mirror thickness can be almost completely avoided with a suitable collector design, i.e. in some cases a collector design is possible whereby the shadowing at far field due to shell thickness is almost completely absent even if the thickness of the shells is not zero but, at the same time, realistic values (from a manufacturing and thermal point of view) are used for the mirror thickness. The use of extended sources 102 helps in reducing the non-uniformity of the far field intensity distribution due to mirror thickness. However, there are cases in which the illuminator 106 and source 102 specifications do not allow a collector design with the above property. In particular, limitations of the optical aperture at the intermediate focus 206 prevent part of the light filling the dips in the far field intensity distribution.

SUMMARY OF THE INVENTION

According to one aspect of the present invention there is provided a collector optical system for EUV and X-ray applications, in which radiation is collected from a radiation source and directed to an image focus, comprising: a plurality of mirrors arranged in nested configuration, the or each mirror being symmetric about an optical axis extending through the radiation source and the or each mirror having at least first and second reflective surfaces, whereby, in use, radiation from the source undergoes successive grazing incidence reflections at said first and second reflective surfaces; and characterised in that one or more of said at least first and second reflective surfaces incorporates a corrective shape so as to compensate the high spatial frequency variation of the far field intensity distribution of said radiation.

Preferably, said corrective shape consists in a proper modification or correction of the nominal shape of each mirror such that part of the radiation is redirected in a direction that fills the dips in the far field intensity distribution.

Preferably, the corrective shape is mathematically described by a proper function or by its power expansion up to a given order. Preferably, the corrective shape is described by a polynomial correction. Preferably, said corrective shape is described by $$\Delta r_i(z) = k_i(c_1 z + c_2 z^2 + c_3 z^3)$$

where $\Delta r_i(z)$ is the variation in the mirror radius and z is the position along the optical axis measured starting from the joint point between the hyperbolic and the elliptical section of each mirror and pointing from the intermediate focus to the source the subscript i enumerates the mirrors from innermost to outermost mirror, and the values for the parameters $k_i$, $c_1$, $c_2$, and $c_3$, are listed in Table A.2. and A.3 hereinbelow.

Preferably, the or each mirror, the mirror is specified by Table A.1 hereinbelow, where 1 is the innermost mirror:

In one embodiment, a total of 7 mirrors in nested configuration are provided.

Preferably, the or each mirror comprises a Wolter I mirror. Preferably, for the or each mirror: the first reflective surface, closest to the source, has a hyperbolic shape. Preferably, for the or each mirror: the second reflective surface, furthest from the source, is obtained by rotating an elliptical profile around an axis that is not an axis of symmetry of the ellipse.

In another embodiment, the or each mirror two of more of the mirrors each have a different geometry.

Preferably, the or each mirror is formed as an electroformed monolithic component, and wherein the first and second reflective surfaces are each provided on a respective one of two contiguous sections of the mirror.

Preferably, one or more of the mirrors has mounted thereon, for example on the rear side thereof, one or more devices for the thermal management of the mirror, for example cooling lines, Peltier cells and temperature sensors.

Preferably, one or more of the mirrors has mounted thereon, for example on the rear side thereof, one or more devices for the mitigation of debris from the source, for example erosion detectors, solenoids and RF sources.

According to another aspect of the present invention there is provided a collector optical system for EUV lithography.

According to another aspect of the present invention there is provided an EUV lithography system comprising: a radiation source, for example a LPP source, the collector optical system as disclosed herein; an optical condenser; and a reflective mask.

In another aspect of the invention, there is provided an imaging optical system for EUV or X-ray imaging.

In another aspect of the invention, there is provided an EUV or X-ray imaging system, comprising: the imaging optical system as disclosed herein; and an imaging device, for example a CCD array, disposed at the image focus.

An advantage of the invention is to compensate the high spatial frequency variation of the far field intensity distribution when this is not possible by a proper design of the Wolter I configuration. The present invention involves suitable modification or correction of the nominal shape of each mirror such that part of the light is redirected in a direction that fills the dips in the far field intensity distribution. This correction can be applied to either the elliptical or hyperbolic part of each Wolter I mirror or to both parts. The correction can be mathematically described by a proper function or by its power expansion up to a given order. In the latter case a polynomial correction is obtained. The amount of the correction must be carefully chosen case by case to optimise the far field intensity distribution. Indeed, a wrong or excessive correction can increase the depth of the dips or produce unwanted peaks at some positions of the far field intensity distribution.

B. Multiple Reflections

A problem with conventional collector designs is that, to improve the overall efficiency of grazing incidence collectors 104, collection of radiation emitted at large angle is required. However, this also implies larger grazing incidence angles (a.k.a. grazing angle) and a consequent limitation of the collector efficiency, as the reflectivity of the coating is a decreasing function of the grazing incidence angle. Thus, for a given design, the increase of the efficiency is smaller and smaller as the collected angle increases.

There is a need to overcome this limitation of the collector efficiency.

According to one aspect of the present invention there is provided a collector optical system for EUV and X-ray applications, in which radiation is collected from a radiation source and directed to an image focus, comprising: a plurality of mirrors arranged in a nested configuration, the or each mirror being symmetric about an optical axis extending through the radiation source and the or each mirror having first and second reflective surfaces, whereby, in use, radiation from the source undergoes successive reflections at said first and second reflective surfaces; and characterised by one or more of the mirrors further comprising a third reflective surface, whereby, in use, radiation from the source undergoes successive reflections at said first, second and third reflective surfaces.

Preferably, for the mirrors having the third reflected surface, the first reflective surface, closest to the source, has a hyperbolic shape, the second reflective surface has a hyperbolic shape, and the third reflected surface, furthest from the source, has an ellipsoid shape. Preferably, the second hyperbolic shape has one focus in common with the first hyperbolic shape and one focus in common with the ellipsoid. Preferably, the second focus of the first hyperbolic shape is the source focus and said second focus of the ellipsoid is the intermediate focus.

Preferably, said plurality of mirrors comprises: a first set of two or more mirrors, the mirrors of said first set having first and second reflective surfaces; and a second set of two or more mirrors, the mirrors of said second set having first, second and third reflective surfaces. Preferably, the first set is innermost in the nested configuration and the second set is outermost in the nested configuration.

Preferably, for said first set, (a) the first reflective surface, closest to the source, has a hyperbolic shape, and/or (b) the second reflective surface, furthest from the source, is obtained by rotating an elliptical profile around an axis that is not an axis of symmetry of the ellipse. Preferably, for the first set, the mirrors are Wolter I or elliptical mirrors.

Preferably, the mirrors of said first set and or said second set are shaped such that the reflections at said first, second and third reflective surfaces are grazing incidence reflections.

In one embodiment, the mirrors are specified in accordance with Tables B.1 and B.2 set out hereinbelow.

Preferably, the or each mirror is formed as an electroformed monolithic component, and wherein the first and second reflective surfaces, and/or said first second and third reflective surfaces, are each provided on a respective one of two contiguous sections of the mirror.

Preferably, one or more of the mirrors has mounted thereon, for example on the rear side thereof, one or more devices for the thermal management of the mirror, for example cooling lines, Peltier cells and temperature sensors.

Preferably, one or more of the mirrors has mounted thereon, for example on the rear side thereof, one or more devices for the mitigation of debris from the source, for example erosion detectors, solenoids and RF sources.

In one embodiment of a full collector, a hybrid configuration may be used (see Section "Hybrid design" below, referring to FIGS. 9 and 10) in which the innermost mirrors are Wolter I (or even elliptical) mirrors whereas the outermost are based on the new proposed configuration. Indeed, an inner (small) 3-reflections mirror would collect a very small solid angle and thus a large number of them would be required if used as innermost mirrors.

Thus, to overcome the limitations of conventional collectors, a new design is proposed in which the number of reflections is increased from 2 in the Wolter configuration to 3. Despite of the loss due to the additional reflection, an advantage of the use of 3 reflections is that it reduces the grazing incidence angles on all reflections and thus allows the collection of larger angles.

C. Hybrid Design

When the optical specifications of the collector 104 require low value for the minimum angle (Numerical Aperture) of the light at the Intermediate Focus, the number of mirrors in a nested Wolter I collector 104 increases rapidly, as innermost mirrors 200 collect only a small fraction of the angular emission from the source (see, e.g., FIG. 2). In such cases, the resulting optical design includes many closely spaced mirrors 200. This situation has two major drawbacks:

1) the final cost of the collector 104 increases with the number of mirrors 200 required to match the optical specifications;
2) since the innermost mirrors 200 are closely spaced, the available space for positioning the cooling system is very limited and may jeopardize the cooling performance.

According to one aspect of the present invention there is provided a plurality of mirrors arranged in a nested configuration, the or each mirror being symmetric about an optical axis extending through the radiation source and the or each mirror having at least one reflective surface, whereby, in use, radiation from the source undergoes a grazing incidence reflection at said at least one reflective surface reflective surface; and characterised by at least two of the mirrors having different geometries, and by the plurality of mirrors being optically matched.

Preferably, the mirrors are optically matched such that there is no, or substantially no, angular gap or obscuration between the solid angle collected by one mirror and the solid angle collected by the adjacent mirrors, and/or such that there is no, or substantially no, angular gap between one mirror and the adjacent mirror on the intermediate focus side of the collector optical system. In this context, "optically matched" means that the shells are designed such that there is no, or substantially no, angular gap or obscuration between the solid angle collected by one shell and the solid angle collected by the adjacent shells. Similarly, there is no, or substantially no, angular gap between one shell and the adjacent shells on the IF side.

In one embodiment, the first, innermost mirror of the plurality of mirrors has one reflective surface and the other mirrors have first and second reflective surfaces, whereby, in use, radiation from the source undergoes successive grazing incidence reflections at the first and second reflective surfaces.

Preferably, said different geometries include Wolter I, elliptical and combination of parabolic profiles.

In one embodiment, said plurality of mirrors comprises: a first set of two or more mirrors, the mirrors of said first set having a first geometry; and a second set of two or more mirrors, the mirrors of said second set having a second geometry, the first geometry and the second geometry being different.

In another embodiment, said plurality of mirrors comprises: a first mirror, the first mirror having a first geometry; and a set of two or more mirrors, the mirrors of said set having a second geometry, the first geometry and the second geometry being different.

Preferably, the first geometry is Wolter I, elliptical or combination of parabolic profiles. Preferably, the second geometry is Wolter I, elliptical or combination of parabolic profiles.

In one embodiment, there are 5 mirrors in the set. Preferably, the first mirror is an elliptical mirror, and the 5 mirrors in the set are Wolter I mirrors. Preferably, the mirrors are as specified in Table D.1 set out hereinbelow.

Preferably, the or each mirror is formed as an electroformed monolithic component, and wherein the first and second reflective surfaces are each provided on a respective one of two contiguous sections of the mirror.

Preferably, one or more of the mirrors has mounted thereon, for example on the rear side thereof, one or more devices for the thermal management of the mirror, for example cooling lines, Peltier cells and temperature sensors.

Preferably, one or more of the mirrors has mounted thereon, for example on the rear side thereof, one or more devices for the mitigation of debris from the source, for example erosion detectors, solenoids and RF sources.

The present invention seeks to reduce the number of mirrors, while matching the given optical specification, for example by a suitable combination of elliptical and Wolter I mirrors in the same collector. In particular embodiments, the use of one or more elliptical mirrors as innermost mirrors in the collector reduces the total number of mirrors. This is mainly because the elliptical mirror collects radiation from the source for all its length whereas a Wolter I mirror collects radiation from the source only on its hyperbolic section.

An advantage of the invention is that the number of shells is reduced and that it allows enough volume available for the cooling.

In certain embodiments, where there are not too many elliptical shells collecting relatively large emission angles, collection efficiency is improved.

BRIEF DESCRIPTION OF THE DRAWINGS

Embodiments of the invention will now be described in detail, by way of example, with reference to the accompanying drawings, in which.

In the description and drawings, like numerals are used to designate like elements. Unless indicated otherwise, any individual design features and components may be used in combination with any other design features and components disclosed herein.

DETAILED DESCRIPTION OF THE INVENTION

In the illustrations of optical elements or systems herein, unless indicated otherwise, cylindrical symmetry around the optical axis is assumed; and references to an "image focus" are references to an image focus or an intermediate focus.

Figure 1:
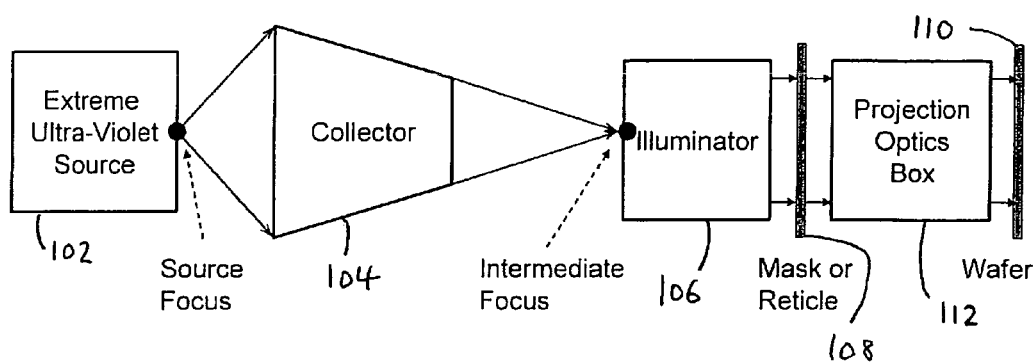
FIG. 1 (PRIOR ART) shows an example of a known EUV lithography system.
Figure 2:
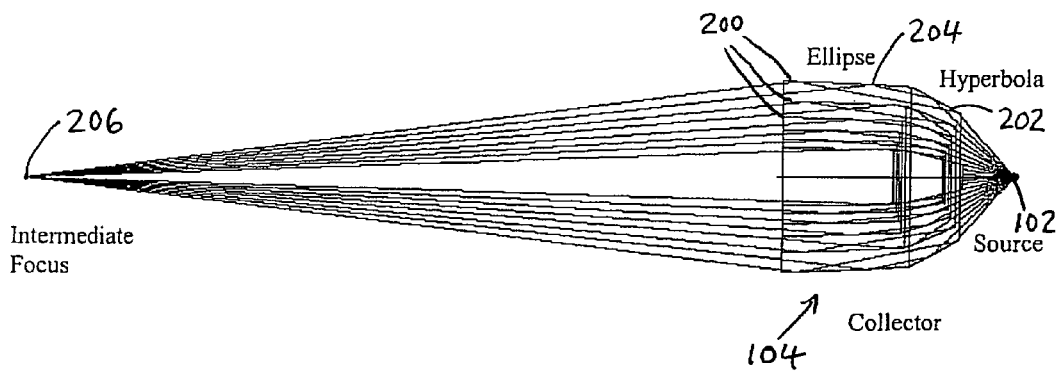
FIG. 2 (PRIOR ART) shows a ray diagram for the collector optics of the EUV lithography system of FIG. 1.

The design and construction of the collector 104 according to the invention is as set out above in relation to FIGS. 1 and 2, except as described hereinafter.

A. Far Field Improvement

Figure 3:
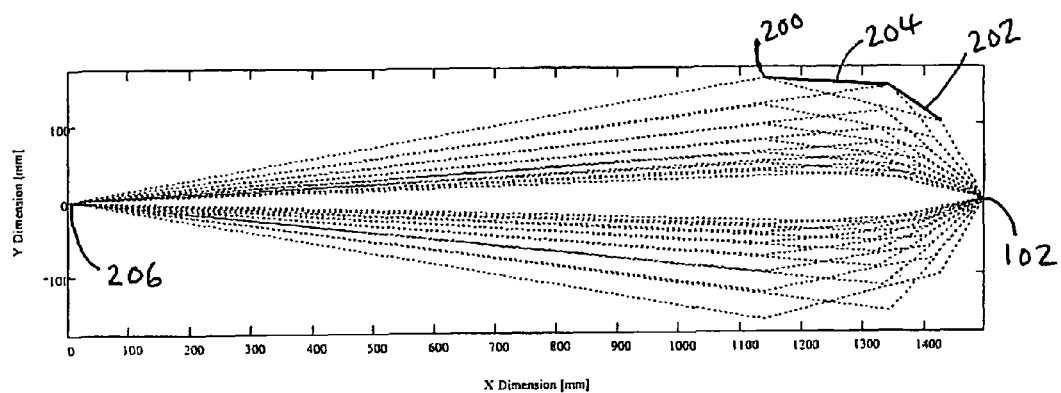
FIG. 3 depicts an embodiment of a nested collector in accordance with one aspect of the invention.

FIG. 3 depicts an embodiment of a nested collector in accordance with one aspect of the invention. This embodiment is the same as described with reference to FIGS. 1 and 2, except as described below. The design here is of a 7-mirror nested Wolter I collector, and the corresponding specifications are listed in Table A.1. However, it will be appreciated by skilled persons that any suitable number of mirrors may be used.

TABLE A.1

| | | Hyperbola | | Ellipse | | Mirror radii [mm] | | |
|---|---|---|---|---|---|---|---|---|
| Mirror # | Type | Conic Constant | Radius of curvature [mm] | Conic Constant | Radius of curvature [mm] | Maximum | Ellipse-hyperbola vertex | Minimum |
| 1 | Wolter I | −1.01019385 | 2.1365 | −0.99852911 | 1.4137 | 36.2242 | 34.3239 | 24.6418 |
| 2 | Wolter I | −1.01738536 | 3.6308 | −0.99755671 | 2.3494 | 46.7105 | 44.1731 | 31.5202 |
| 3 | Wolter I | −1.02914859 | 6.0526 | −0.99599879 | 3.8505 | 59.8238 | 56.4726 | 40.0528 |
| 4 | Wolter I | −1.04841826 | 9.9610 | −0.99350491 | 6.2582 | 76.3193 | 71.9129 | 50.6512 |
| 5 | Wolter I | −1.08035217 | 16.2846 | −0.98949472 | 10.1427 | 97.2646 | 91.4560 | 63.8362 |
| 6 | Wolter I | −1.13469930 | 26.6371 | −0.98296834 | 16.4983 | 124.2702 | 116.5224 | 80.2740 |
| 7 | Wolter I | −1.23207212 | 44.0419 | −0.97209459 | 27.1823 | 159.9860 | 149.3855 | 100.8206 |

Figure 4:
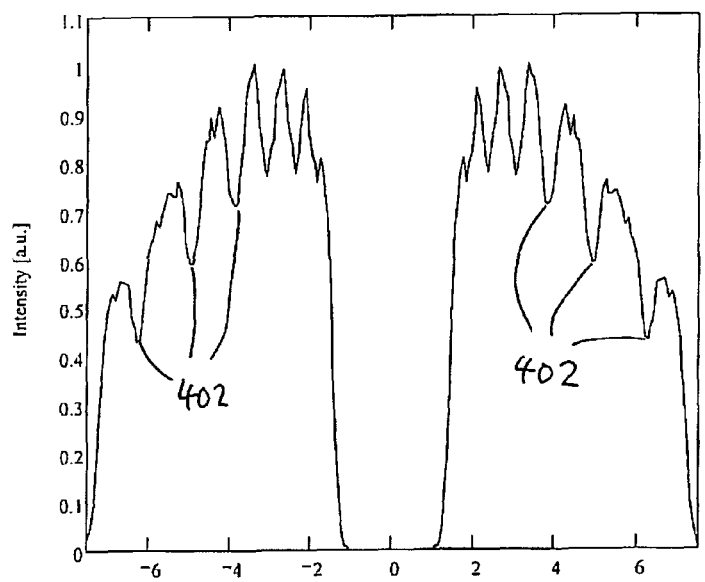
FIG. 4 illustrates the far field intensity distribution simulated by ray tracing for a conventional collector and without the inclusion of the present invention.

The far field intensity distribution simulated by ray tracing for a spherical extended source with a FWHM of 0.5 mm and without the inclusion of the present invention is shown in FIG. 4. The 6 dips 402 in the far field intensity distribution that are evident in FIG. 4 are due to the shadowing of the mirror thickness. The shadow of the outermost mirror is of course not evident in FIG. 4.

In accordance with this embodiment of the invention, onto the nominal design of FIG. 3 is superimposed a polynomial correction given by the following equation, for both the hyperbolic and the elliptical section 204 of each shell (mirror) 200, $$\Delta r_i(z) = k_i(c_1 z + c_2 z^2 + c_3 z^3)$$

where $\Delta r_i(z)$ is the variation in the mirror radius and z is the position along the optical axis in millimeters measured starting from the joint point between the hyperbolic and the elliptical section of each mirror and pointing from the intermediate focus to the source. The subscript i in the above equation enumerates the mirrors from 1 (innermost mirror) to 7 (outermost mirror). The values for the parameters $k_i$, $c_1$, $c_2$, and $c_3$, are listed in Table A.2. and A.3.

TABLE A.2

| | k | |
|---|---|---|
| Mirror # | Hyperbola | Ellipse |
| 1 | 0.3 | 0.2 |
| 2 | 0.3 | 0.5 |
| 3 | 0.3 | 0.7 |
| 4 | 0.3 | 0.8 |
| 5 | 0.3 | 1 |
| 6 | 0.3 | 1 |
| 7 | 0.3 | 1 |

TABLE A.3

| Parameter | Hyperbola | Ellipse |
|---|---|---|
| $c_1$ | 0.001 | 0.00005 |
| $c_2$ | −0.00001 | −0.00000035 |
| $c_3$ | −0.00000001 | −0.0000000005 |

Figure 5:
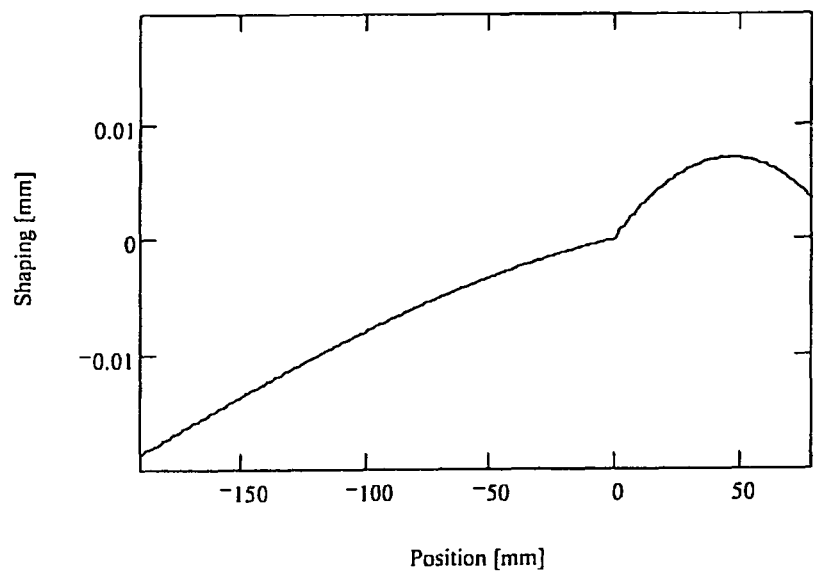
FIG. 5 shows an example of the correction for a mirror in accordance with one aspect of the invention, for the collector of FIG. 3.
Figure 6:
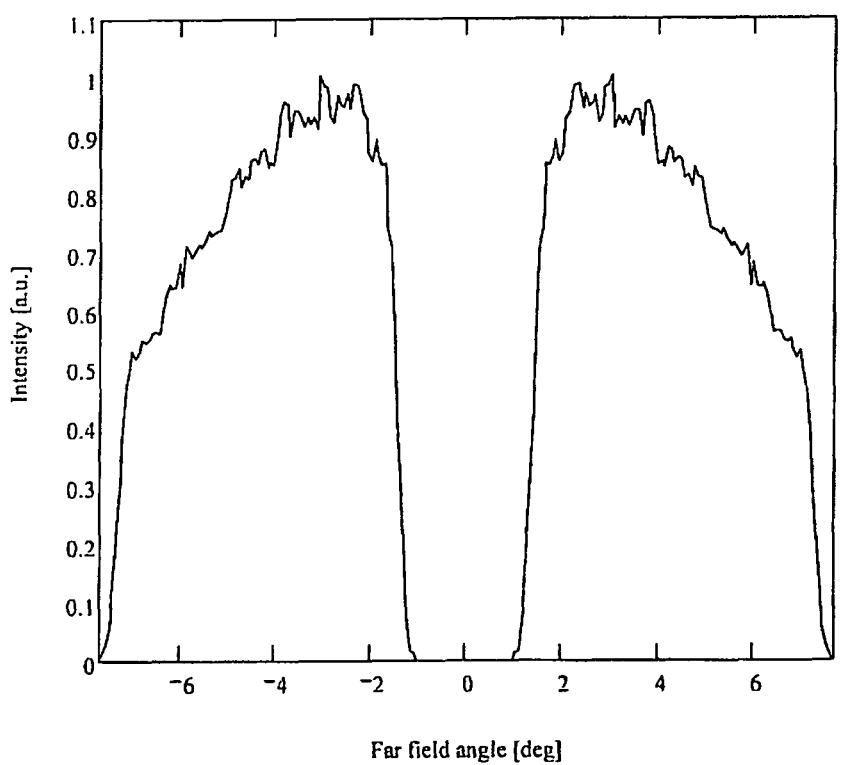
FIG. 6 shows the result of the ray tracing of the collector of FIG. 3 with the correction according to the invention.

An example of the above correction for mirror #5 is shown in FIG. 5. The result of the ray tracing of the collector of FIG. 3 with the corrections given in Table A.2 and Table A.3 is shown in FIG. 6. It can be noted that the dips in the far field distribution due to the shadowing of the mirror thickness have disappeared.

The present invention has been here described with reference to a Wolter I optical design for the collector configuration. However, it may be equally well applied to any optical configuration based on nested mirrors, including, in particular, pure elliptical designs.

B. Multiple Reflections

Figure 7:
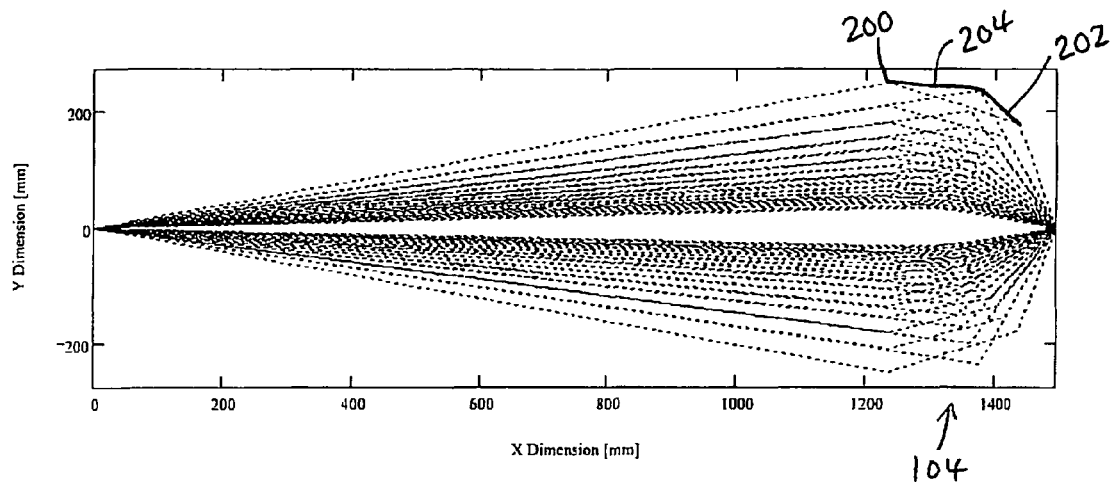
FIG. 7 (PRIOR ART) illustrates a Wolter I collector consisting of 15 shells, designed to collect large angles.

FIG. 7 (PRIOR ART) shows the design of a conventional Wolter I collector consisting of 15 shells (mirrors), designed to collect large angles. For clarity/simplicity, only the outer mirror 200 is highlighted: this has first 202 and second 204 reflective surfaces. The design parameters are listed in Table B.1.

TABLE B.1

| Mirror # | Type | Hyperbola Conic Constant | Hyperbola Radius of curvature [mm] | Ellipse Conic Constant | Ellipse Radius of curvature [mm] | Mirror radii [mm] Maximum | Mirror radii [mm] Ellipse-hyperbola vertex | Mirror radii [mm] Minimum |
|---|---|---|---|---|---|---|---|---|
| 1 | Wolter I | −1.01019385 | 2.1365 | −0.99852911 | 1.4137 | 35.3252 | 34.3239 | 29.2746 |
| 2 | Wolter I | −1.01380178 | 2.8875 | −0.99803171 | 1.8922 | 40.8749 | 39.6810 | 33.7193 |
| 3 | Wolter I | −1.01848425 | 3.8582 | −0.99739256 | 2.5075 | 47.0620 | 45.6488 | 38.6538 |
| 4 | Wolter I | −1.02454641 | 5.1084 | −0.99657323 | 3.2967 | 53.9760 | 52.3122 | 44.1406 |
| 5 | Wolter I | −1.03239021 | 6.7151 | −0.99552402 | 4.3084 | 61.7236 | 59.7716 | 50.2520 |
| 6 | Wolter I | −1.04255366 | 8.7791 | −0.99417996 | 5.6059 | 70.4351 | 68.1489 | 57.0718 |
| 7 | Wolter I | −1.05577182 | 11.4338 | −0.99245489 | 7.2738 | 80.2730 | 77.5949 | 64.6991 |
| 8 | Wolter I | −1.07307485 | 14.8598 | −0.99023248 | 9.4269 | 91.4447 | 88.3007 | 73.2527 |
| 9 | Wolter I | −1.09430983 | 19.4418 | −0.98755786 | 12.0871 | 104.1079 | 100.5148 | 83.1861 |
| 10 | Wolter I | −1.12243334 | 25.3834 | −0.98409595 | 15.5415 | 118.6004 | 114.4429 | 94.2993 |
| 11 | Wolter I | −1.16163731 | 33.0910 | −0.97941741 | 20.1821 | 135.4602 | 130.5096 | 106.6401 |
| 12 | Wolter I | −1.21697553 | 43.3984 | −0.97309226 | 26.4698 | 155.4237 | 149.3995 | 120.6282 |
| 13 | Wolter I | −1.29756350 | 57.6394 | −0.96442027 | 35.1577 | 179.5869 | 172.0902 | 136.7247 |
| 14 | Wolter I | −1.42211299 | 78.1026 | −0.95213443 | 47.6020 | 209.7405 | 200.1068 | 155.4179 |
| 15 | Wolter I | −1.63312120 | 109.3155 | −0.93389437 | 66.3805 | 249.0615 | 236.0823 | 177.3177 |

Figure 8:
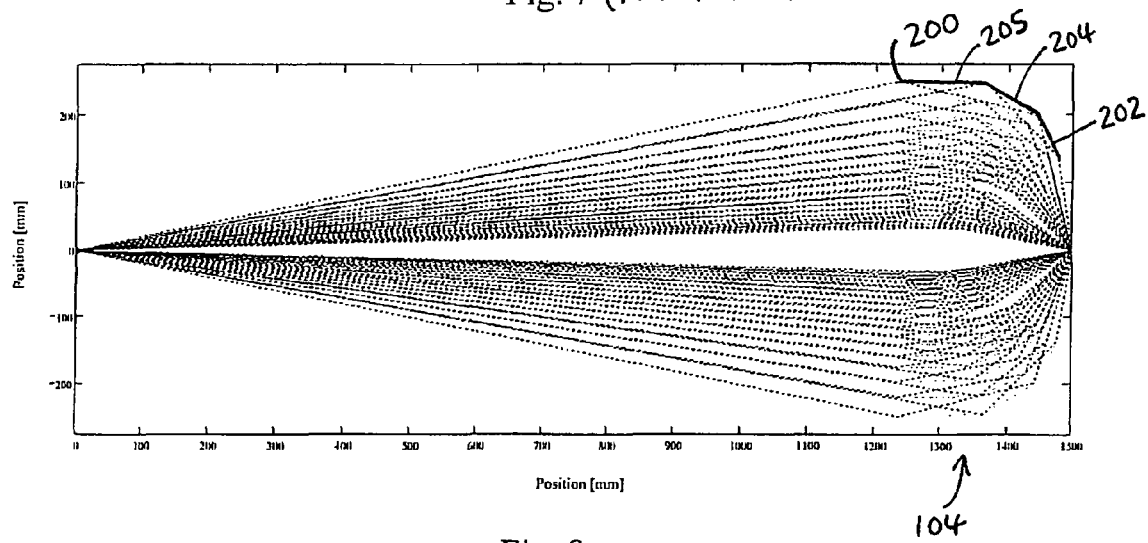
FIG. 8 shows an embodiment of a nested collector in accordance with one aspect of the invention, and matching the same specification in terms of Numerical Aperture at intermediate focus as the collector of FIG. 7.

FIG. 8 shows an embodiment of a collector based on the invention and matching the same specification in terms of Numerical Aperture at intermediate focus of the Wolter design of FIG. 7. The collector in FIG. 8 consists of 17 mirrors. However, it will be appreciated by skilled persons that any suitable number of mirrors may be used. The first 9 inner mirrors in FIG. 8 are Wolter I mirrors, identical to the first 9 inner mirrors of FIG. 7. The outer 8 mirrors are in accordance with the invention: for clarity/simplicity, only the outer mirror 200 is highlighted: this has first 202 and second 204 and third 205 reflective surfaces. The design parameters for this embodiment are provided in Tables B.2 and B.3.

TABLE B.2

| Mirror # | Type | 1st Hyperbola Conic Constant | 1st Hyperbola Radius of curvature [mm] | 2nd Hyperbola Conic Constant | 2nd Hyperbola Radius of curvature [mm] | Ellipse Conic Constant | Ellipse Radius of curvature [mm] |
|---|---|---|---|---|---|---|---|
| 10 | 3 reflections | −1.33758725 | 21.3244 | −1.04207680 | 12.9908 | −0.98976428 | 11.7106 |
| 11 | 3 reflections | −1.46555915 | 23.7944 | −1.05648598 | 17.9347 | −0.98746339 | 14.3598 |
| 12 | 3 reflections | −1.63207184 | 27.4985 | −1.07383470 | 23.7013 | −0.98456808 | 17.7021 |
| 13 | 3 reflections | −1.81172763 | 34.3724 | −1.09104852 | 28.8721 | −0.98097774 | 21.8605 |
| 14 | 3 reflections | −2.03509277 | 44.2012 | −1.11060710 | 34.3523 | −0.97651910 | 27.0459 |
| 15 | 3 reflections | −2.46210484 | 54.5611 | −1.14332818 | 44.1901 | −0.97077220 | 33.7649 |
| 16 | 3 reflections | −2.93371314 | 76.3229 | −1.14609546 | 56.1803 | −0.96903340 | 38.6701 |
| 17 | 3 reflections | −4.17455417 | 93.2478 | −1.23744029 | 70.0556 | −0.95401338 | 53.5898 |

TABLE B.3

| Mirror # | Type | Mirror radii [mm] Minimum | Mirror radii [mm] 1st hyperbola - 2nd hyperbola vertex | Mirror radii [mm] Ellipse - 2nd hyperbola vertex | Mirror radii [mm] Maximum |
|---|---|---|---|---|---|
| 10 | 3 reflections | 79.4910 | 97.7987 | 114.2028 | 115.3360 |
| 11 | 3 reflections | 84.4112 | 108.0994 | 126.4284 | 127.7924 |
| 12 | 3 reflections | 90.2220 | 119.6290 | 140.3750 | 141.9930 |
| 13 | 3 reflections | 99.0188 | 132.2649 | 156.0743 | 157.9382 |
| 14 | 3 reflections | 109.4400 | 146.1280 | 173.7322 | 175.8772 |
| 15 | 3 reflections | 117.4959 | 161.9175 | 194.2078 | 196.8072 |
| 16 | 3 reflections | 136.7241 | 184.9095 | 218.5841 | 219.7478 |
| 17 | 3 reflections | 136.6512 | 198.9031 | 245.1200 | 249.0386 |

Using a reference reflectivity profile for Ruthenium at 13.5 nm, the new design of FIG. 8 has an efficiency of about 21% greater than the Wolter I design of FIG. 7. As the plasma sources used in EUV lithography have a very low efficiency, even small increases of the collector efficiency implies great benefits in term of diminished thermal power from the source.

C. Hybrid Design

Figure 9:
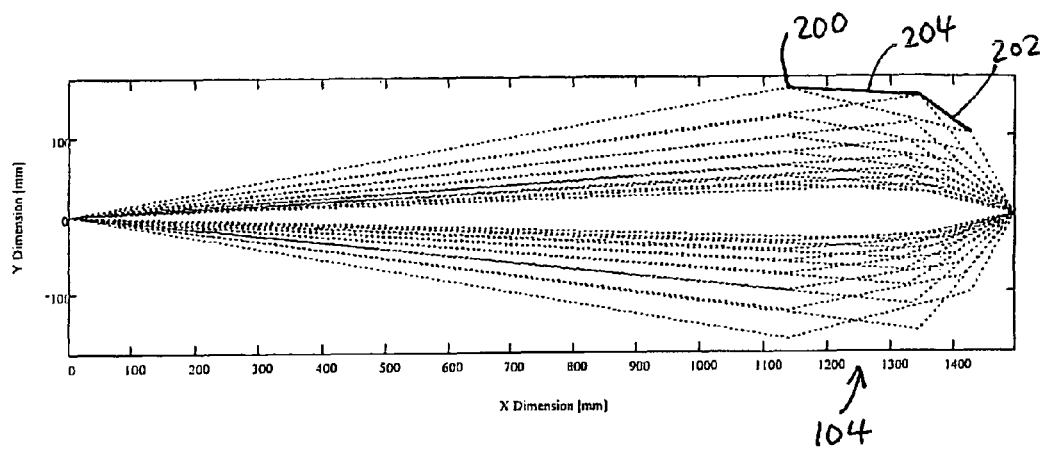
FIG. 9 (PRIOR ART) illustrates an example of the optical layout of a nested grazing incidence Wolter I collector with 7.

FIG. 9 (PRIOR ART) shows the optical layout of a nested grazing incidence Wolter I collector with 7 mirrors, designed to illuminate the intermediate focus with radiation between 1.5° and 8°. For clarity/simplicity, only the outer mirror 200 is highlighted: this has first 202 and second 204 reflective surfaces.

Figure 10:
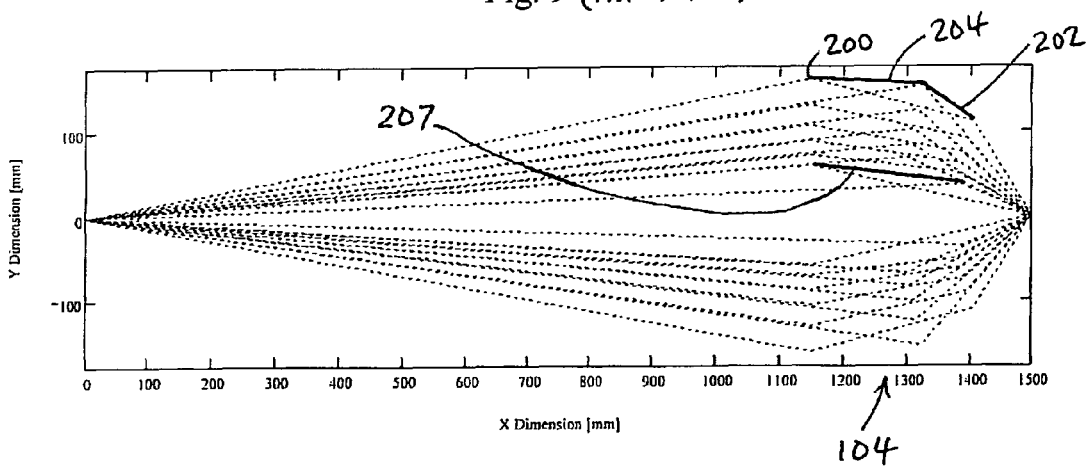
FIG. 10 shows an embodiment of a nested collector in accordance with one aspect of the invention, and matching the same optical specifications as the collector of FIG. 9.

FIG. 10 shows a design matching the same optical specifications as the collector of FIG. 9, but configured in accordance with the present invention. It consists of 1 elliptical mirror as the innermost mirror 207, followed by 5 Wolter I mirrors. However, it will be appreciated by skilled persons that any suitable number of mirrors may be used. (For clarity/simplicity, only the outer mirror 200 is highlighted: this has first 202 and second 204 reflective surfaces.) It can be noted, when comparing the collector 104 of FIG. 10 to that of FIG. 9, that the total number of mirrors 200 is decreased from 7 to 6, and that the shadow region on the rear side of the mirror 200 that can be used to position the cooling system is increased. Thus, manufacturing complexity is reduced and enhanced cooling is facilitated.

The dimensions of the embodiment shown in FIG. 10 are listed in Table D.1.

TABLE D.1

| | | Hyperbola | | Ellipse | | Mirror radii [mm] | | |
| --- | --- | --- | --- | --- | --- | --- | --- | --- |
| Mirror # | Type | Conic Constant | Radius of curvature [mm] | Conic Constant | Radius of curvature [mm] | Maximum | Ellipse-hyperbola vertex | Minimum |
| 1 | Ellipse | — | — | −0.99165756 | 6.2831 | 58.3310 | — | 36.3780 |
| 2 | Wolter I | −1.03662221 | 7.9277 | −0.99441040 | 5.4394 | 71.5153 | 68.3835 | 50.8913 |
| 3 | Wolter I | −1.05571905 | 11.9520 | −0.99165225 | 8.1347 | 87.5221 | 83.5727 | 61.7865 |
| 4 | Wolter I | −1.08493511 | 17.9720 | −0.98754639 | 12.1609 | 107.1304 | 102.1277 | 74.8727 |
| 5 | Wolter I | −1.12852641 | 27.2703 | −0.98164975 | 18.0654 | 131.2648 | 125.0704 | 91.1342 |
| 6 | Wolter I | −1.19754721 | 41.5917 | −0.97281004 | 27.0270 | 161.5243 | 153.7090 | 110.7959 |

Alternative embodiments may involve including or combining mirrors of different geometry in different positions in the nested collector, including Wolter I mirrors, elliptical mirrors, and a combination of parabolic mirrors.

Encompassed by the invention are collector optics for imaging (e.g. EUV or X-ray), and imaging systems incorporating such optics; the design of such imaging optics and imaging systems is discussed in, for example, European patent application no. 06425539.1 (attorney's ref. ML00H19/P-EP).

The invention claimed is:

1. A collector optical system for extreme ultraviolet (EUV) and X-ray applications in which EUV or X-ray radiation from a radiation source is directed to form a far-field intensity distribution, comprising:
a plurality of mirrors arranged in a nested and symmetric configuration about an optical axis that extends through the radiation source, with each mirror having at least first and second reflective surfaces configured to respectively grazingly reflect the radiation to form the far-field intensity distribution; and
wherein that at least one of the first and second reflective surfaces includes a polynomial corrective shape that compensates for high-spatial-frequency variations in the far-field intensity distribution that arise in the absence of the polynomial corrective shape.

2. The collector optical system of claim 1, wherein the first and second reflective surfaces, before applying the corrective polynomial, respectively comprise hyperbolic and elliptical sections, wherein the first reflective surface is closer to the radiation source than the second reflective surface.

3. The collector optical system of claim 1, wherein each mirror comprises an electroformed monolithic component.

4. The collector optical system of claim 1, wherein the each mirror includes at least one type of thermal management device.

5. An EUV lithography system comprising:
The collector optical system of claim 1;
an optical condenser arranged to receive collected radiation from the collector optical system; and
a reflective mask arranged to receive condensed radiation from the optical condenser.

6. A collector optical system for extreme ultraviolet (EUV) and X-ray applications in which EUV or X-ray radiation from a radiation source is directed to form a far-field intensity distribution, comprising:
a plurality of mirrors arranged in a nested and symmetric configuration about an optical axis that extends through the radiation source, with each mirror having at least first and second reflective surfaces configured to respectively grazingly reflect the radiation, and wherein the plurality of mirrors comprises: a first set of two or more mirrors having said first and second reflective surfaces and no third reflecting surface, and a second set of two or more mirrors having said first, second and third reflective surfaces, wherein the
third reflective surfaces reflect radiation reflected from the first and second reflective surfaces of the same mirror.

7. The collector optical system of claim 6, wherein:
the first reflective surface is closest to the radiation source and has a hyperbolic shape;
the second reflective surface has a hyperbolic shape; and
the third reflective surface is farthest from the radiation source and has an ellipsoidal shape.

8. The collector optical system of claim 6, wherein the second hyperbolic shape has two foci, with one focus being in common with a focus of the first hyperbolic shape and the other focus being in common with a focus of the third ellipsoidal shape.

9. The collector optical system of claim 6, wherein each mirror is an electroformed monolithic component.

10. The collector optical system of claim 6, wherein the each mirror includes at least one type of thermal management device.

11. The collector optical system of claim 6, wherein the system has an image focus and further comprising an imaging device disposed at the image focus.

12. An EUV lithography system comprising:
The collector optical system of claim 6;
an optical condenser arranged to receive collected radiation from the collector optical system; and
a reflective mask arranged to receive condensed radiation from the optical condenser.

* * * * *